(12) United States Patent
Lazovsky (10) Patent No.: US 7,485,840 B2
(45) Date of Patent: Feb. 3, 2009

(54) SEMICONDUCTOR CHARGE MULTIPLICATION AMPLIFIER DEVICE AND SEMICONDUCTOR IMAGE SENSOR PROVIDED WITH SUCH AN AMPLIFIER DEVICE

(75) Inventor: Leonid Yurievich Lazovsky, Waterloo (CA)

(73) Assignee: DALSA Corporation, Waterloo (CA)

( * ) Notice: Subject to any disclaimer, the term of this patent is extended or adjusted under 35 U.S.C. 154(b) by 14 days.

(21) Appl. No.: 11/703,765

(22) Filed: Feb. 8, 2007

(65) Prior Publication Data

US 2008/0192882 A1    Aug. 14, 2008

(51) Int. Cl.
*H01L 31/00* (2006.01)

(52) U.S. Cl. ............ 250/214.1; 348/312; 257/236; 257/237; 377/57; 377/61; 377/62

(58) Field of Classification Search ........... 250/214.1; 348/312; 257/236, 237; 377/57, 61, 62
See application file for complete search history.

(56) References Cited

U.S. PATENT DOCUMENTS

| 5,337,340 A | 8/1994 | Hynecek |
| 5,401,952 A | 3/1995 | Sugawa |
| 6,862,333 B2 | 3/2005 | Kashima et al. |
| 2005/0029553 A1* | 2/2005 | Hynecek .................... 257/223 |
| 2006/0231738 A1 | 10/2006 | Robbins |

FOREIGN PATENT DOCUMENTS

EP    0 866 501 B1    2/1998

* cited by examiner

*Primary Examiner*—Seung C Sohn
(74) *Attorney, Agent, or Firm*—Fisher Technology Law PLLC

(57) ABSTRACT

A charge multiplication amplifier device comprises a series arrangement of a first separation barrier facility, a temporary storage well for charge carriers, a second charge transfer barrier facility, an impact ionization facility that is operative through electric field strength effective on mobile charge carriers, and a charge collection well for receiving charge carriers so multiplied.

Advantageously, the device comprises a charge collection and transfer facility (32) that is geometrically disposed next to the impact ionization facility (31) whereas impact ionization facility is controlled at a substantially static electric potential (DC1, DC2) for controlling the electric field strength.

Advantageously, another embodiment of this device comprises charge collection and transfer facilities (41, 42) implemented as two (or more) independently clocked signals Φ1, Φ2 that require nearly two times less swing to achieve same effect.

12 Claims, 4 Drawing Sheets

Fig 1.

Charge multiplication

SEMICONDUCTOR CHARGE MULTIPLICATION AMPLIFIER DEVICE AND SEMICONDUCTOR IMAGE SENSOR PROVIDED WITH SUCH AN AMPLIFIER DEVICE

BACKGROUND OF THE INVENTION

The invention relates to a semiconductor charge multiplication amplifier device stage that comprises a series arrangement of a plurality of clock electrodes (81,82) on top of a semiconductor body for transporting through the semiconductor body packages of charge carriers from an image sensor section towards an output section, the device further comprising an impact ionization facility for by means of applying an electric field strength multiplying the charge carriers during their transport from the image section to the output section, Prior art, as represented by U.S. Pat. No. 5,337,340 to Jaroslav Hynecek and assigned to Texas Instruments of Dallas, Tex., has recognized advantageous properties of charge multiplication devices which are operative through ionizing field strengths, or colloquially called "avalanche devices" that are especially, but not exclusively, intended for use in image sensor devices based on CCD technology. This technology allows charge signal amplification before detection in a CCD readout node, for so almost completely eliminating any noise that could be associated with an electronic on-chip pre-amplifier. For the case of CCD imagers, this latter aspect fortunately allows application at extremely low input light intensities.

However, various drawbacks are associated to the prior art technology. Firstly, the technology requires a high frequency clock source for controlling various voltages at precisely monitored and tightly controlled voltage levels for ensuring both high and also time-uniform amplification factors. Secondly, and even more pertinent, the recited prior art is deficient in providing a linear amplification, because the charge multiplication in an output register strongly depends on the effective potential difference under adjacent gates in a multiplication stage. This difference in potential is in particular modulated by the accumulated charge packet itself, and therefore, the amount of modulation depends on the amount of accumulation.

SUMMARY TO THE INVENTION

In consequence, amongst other things, it is an object of the present invention to isolate the amplification to a large degree from dynamic effects by separating the amplification proper from the gating and switch-over and storage aspects of the device.

Now therefore, according to one of its aspects, the invention is characterized in that it comprises a charge-biasing facility below which as viewed in projection the impact ionization facility is formed in the semiconductor body, which is positioned as viewed in projection between two neighboring clock electrodes and which is arranged for being driven at a first substantially static electric potential (DC2) for controlling the electric field strength in the impact ionization facility. Especially, the static control of the output side of the amplification allows for mitigating the above modulating effects.

Advantageously, the impact ionization facility is arranged for being driven at a second substantially static electric potential (DC1) for collectively with said first substantially static electric potential (DC2) controlling the electric field strength in the impact ionization facility. Now, the difference between two static voltages will completely and precisely control the electric field strength in the impact ionization region.

Advantageously, an electrode for applying said first substantially static electric potential (DC2) is followed by at least one output electrode that is arranged for being driven by at least one first dynamic electric potential (30,32) for removing charge carriers away from said impact ionization facility. This raises the operational stability of the device still further by resorting to stable and straightforward DC potentials.

Advantageously, such device stage is arranged in a multi-stage amplification facility, wherein successive impact ionization facilities are separated by a sequence of at least a first and a second pulsed control electrode, that are driven by a first and a second dynamic partial electric potential, respectively, wherein said first and second partial potentials are overlapping for collectively bringing charge carriers from the first static electric potential (DC2) of a preceding stage to the second static electric potential (DC1) of a next succeeding stage. Combined with earlier advantageous features, this arrangement will diminish the necessary amplitudes of the pulsed control voltages.

Further advantageous aspects of the invention are recited in dependent Claims.

BRIEF DESCRIPTION OF THE DRAWING

These and further features, aspects and advantages of the invention will be discussed more in detail hereinafter with reference to the disclosure of preferred embodiments of the invention, and in particular with reference to the appended Figures that illustrate.

DETAILED DESCRIPTION OF PREFERRED EMBODIMENTS

Figure 1:
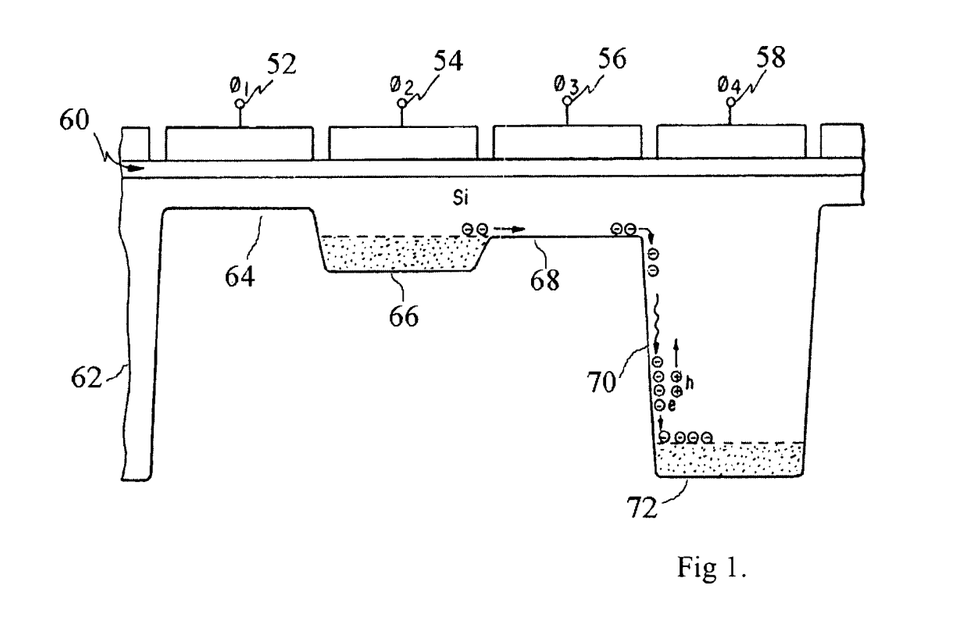
FIG. 1, a comprehensive cross-sectional view of a prior art device with associated controls.

First, for better understanding of the invention, a device according to the prior art will be briefly presented. In this respect, FIG. 1 illustrates a comprehensive cross-sectional view 50 of such prior art device together with associated controls. First, a solid-state circuitry representation is shown at the top of the Figure. As shown, a repetitive pattern of electrodes 52 through 58 is present from left to right, each electrode of a group of four adjacent electrodes having its own clock pulse sequence numbered from Φ1 to Φ4. As shown, the electrodes are disposed on a silicon gate oxide layer 60 that itself sits on p-type silicon substrate 62. For brevity, driving electronics and input/output facilities have been omitted. The present invention lends itself to various alternative implementations such as n-type silicon, which alternatives will furthermore not be specifically discussed for brevity.

As furthermore shown, a potential curve for the channel from left to right has been shown at the bottom of the picture, the charge carrier electrons traveling from left to right. Only a single amplification stage has been shown, and furthermore, with voltage levels being represented in an inverse manner. First, item 64 represents a pixel separation barrier under the electrode 52, that provides separation between adjacent pixel charges. Item 66 is a temporary storage well for containing the charge carriers, in particular electrons that have been propagated from a previous stage. Note that charge carriers are shown as small circles with negative (−) and positive (+) charges, respectively. Item 68 is a charge transfer barrier that keeps the contents of storage well 66 guarded as long as its barrier potential is sufficient. With the impact ionizing field 70 operative, charge carriers that surmount barrier 68 will be accelerated and collectively result in amplification by impact ionization. Subsequently the amplified charge will be kept contained in charge collection well 72 under the electrode 58.

Generally, the amplification factor that is implemented for a single step or stage is quite low, such as in the range of a few percent or even much lower. A succession of many such steps may produce a much higher amplification factor, such as in the range of 100 or 1000. Furthermore, the relatively few charges of opposing sign (+) will travel back the slope 70 upward but will get quickly trapped in the semiconductor structure of the device. This removal feature will furthermore keep noise levels low.

Figure 2:
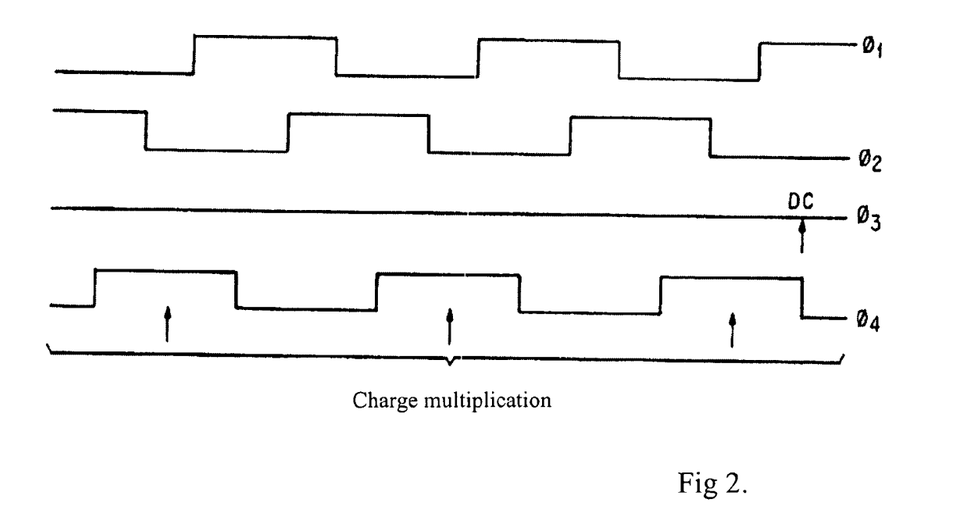
FIG. 2, a timing diagram for charge multiplication operation of FIG. 1.

FIG. 2 illustrates a timing diagram for charge multiplication operation of FIG. 1. Time runs from left to right and as shown, electrodes 54, 56 and 58 are cyclically pulsed. Electrode 56 gets a constant voltage $\Phi 3$ applied. A falling potential $\Phi 2$ will inject stored charge carriers over the transfer barrier 68 into the high field region 70 as indicated by the arrows. Thereupon, potential $\Phi 1$ is driven high and $\Phi 4$ is driven low, followed by making 54 ($\Phi 2$) high and 52 ($\Phi 1$) back low again. It should be clear that the potential difference between barrier 68 and well 72 will influence the amplification factor. Experience has shown that the amplification is roughly exponential in the voltage difference, amplification factors running over several orders of magnitude. Note that applicable voltage differences can go up to 20-30 volts, and that perfect voltage steps are extremely difficult to achieve.

Figure 2A:
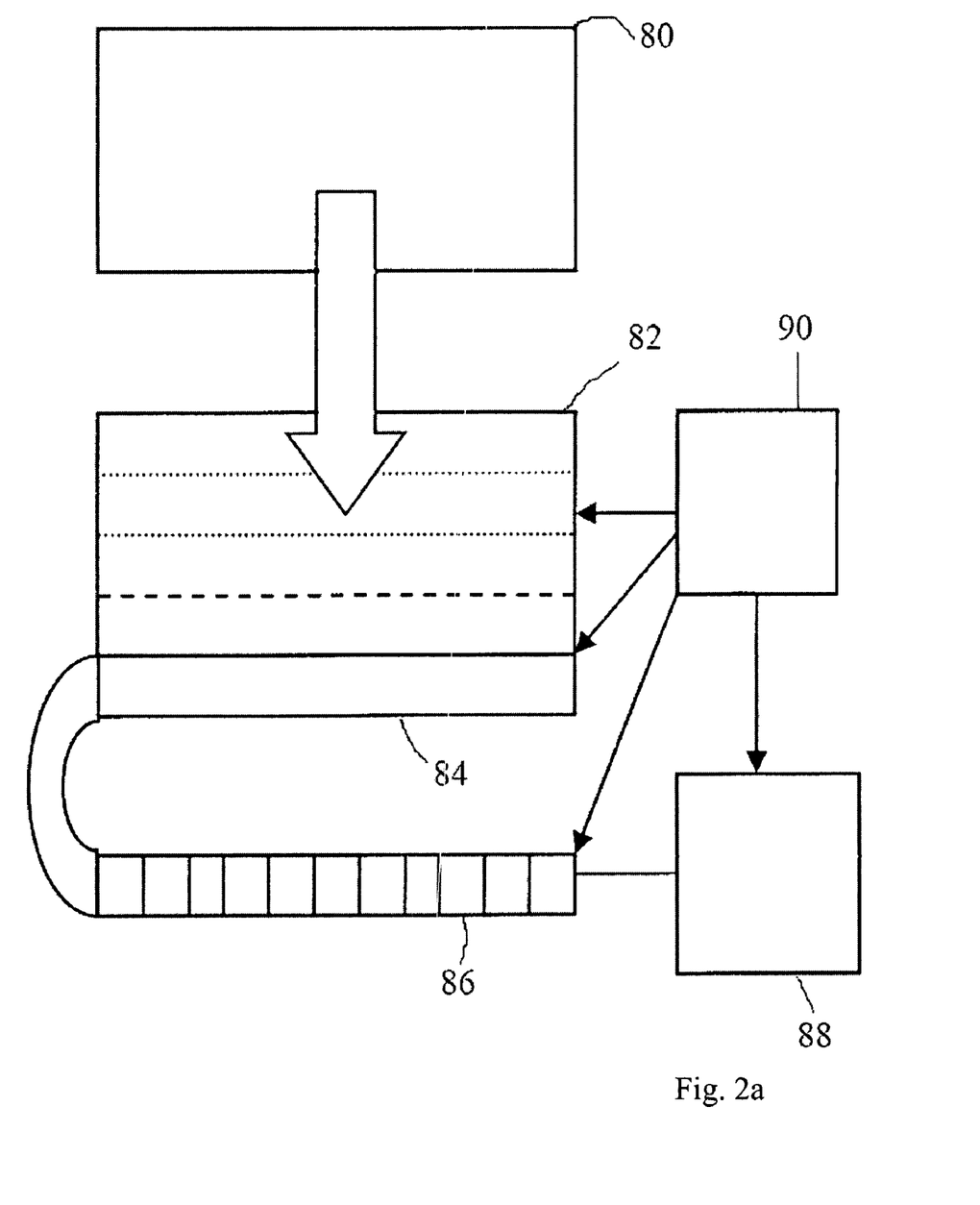
FIG. 2*a*, an overall schematic of an image intensifier device.

FIG. 2a illustrates an overall schematic of an image sensor device. First, block 80 symbolizes the two-dimensional image that can be of any applicable origin, but a prime example are medical images. Through applicable pickup elements not specifically shown, the pixel-associated charges are stored in storage matrix facility 82. Through line wise addressing of the storage matrix 82, a row of pixels is transferred in parallel to serial shift register 84. Thereupon, linear shifting of the pixels through shift register 84 will successively present their charges to avalanche amplifier arrangement 86 that comprises a succession of stages. The output of the amplifier feeds processing facility 88 for further usage. Control facility 90 as indicated by various arrows, produces row selection for matrix 82, clocking for shift register 84 and amplifier 86, and overall control for processing facility 88 and other elements that need control.

Figures 3A, 3B:
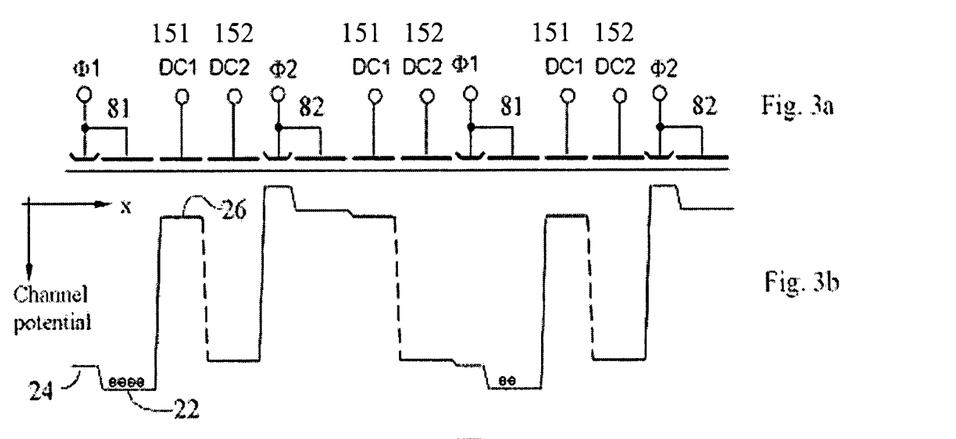
FIG. 3*a*, a view of various controls used for a first embodiment of the present invention.
FIGS. 3*b*-3*d*, various time-sequential voltage profiles in the device of FIG. 3*a*.

FIG. 3a illustrates a view of various controls used for a first device of the present invention. A principal difference with regards to FIG. 1 is the providing of two DC electrodes DC1 (151) and DC2 (152) for each stage of the amplification chain. As shown in FIG. 3b by means of the dashed line, the amplification is controlled exclusively by the high voltage difference between the two direct-current electrodes at either side of the steep slope. It has been found that the amplification factor, by means of the DC voltage difference, is now much easier to control in a reliable and temporally uniform manner. The additionally required space for these electrodes is considered negligible, especially, when the amplification is executed within a single serial arrangement such as amplifier 86 in FIG. 2a.

Figures 3C, 3D:
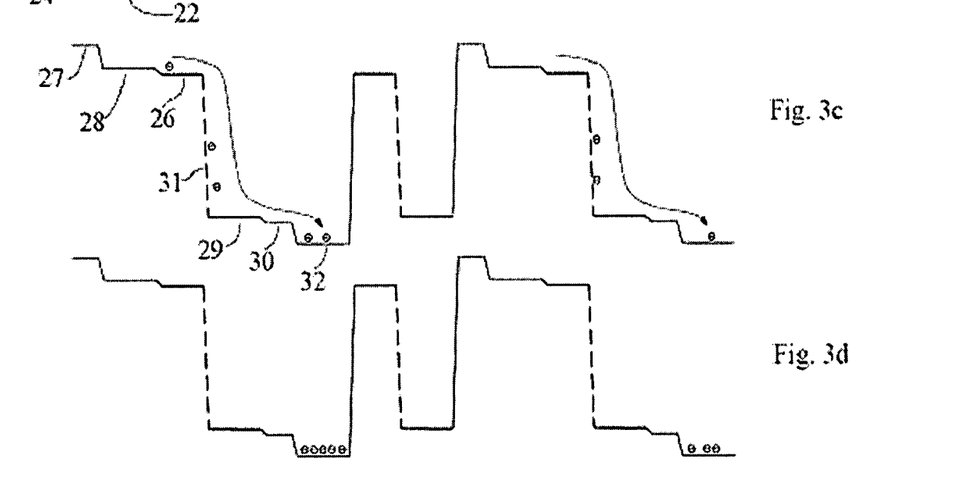
Figure 3E:
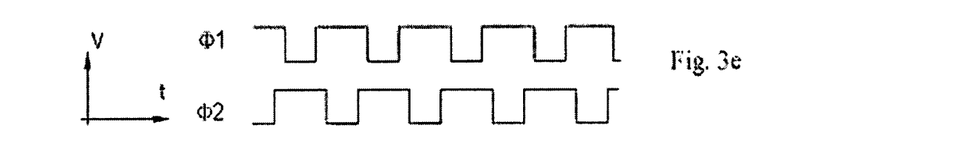
FIG. 3*e*, showing timing diagram with overlapping clock signals Φ1, Φ2.

FIGS. 3b-3d illustrate various time-sequential voltage profiles in the device of FIG. 3a, with timing diagrams for signals $\Phi 1$, $\Phi 2$ being shown in FIG. 3e. In FIG. 3b, the charge carriers are contained through $\Phi 1$ (31) at location 22 before the barrier at 26.

In FIG. 3c, $\Phi 1$ is pulsed somewhat below voltage at DC1, so that charge is injected over barrier 26. The differences between voltages at locations 27/28/26 are now too small to cause any measurable amplification. The two voltages (27, 28) induced by $\Phi 1$ differ by a relatively small step, that can be implemented by various technological steps, such as through different thicknesses of the Silicon oxide layer, by giving one of the electrodes somewhat additional p-dope, or rather introducing some n-dope in the other electrode. Persons skilled in the art will recognize the relevance of these steps. The combination of the small voltage steps (27, 28, 26) will propel the electrons from well 22 towards the accelerating voltage slope 31, for so effecting the amplification.

The difference between the low pulse level at electrode 81 and the voltage at DC1 (151) is too small to cause any amplification. The same applies to the two small steps upward from level DC2 (52) to pulsed levels at $\Phi 2$ (82) and channel potentials 30 and 32, respectively. The latter two will quickly remove any electrons (either primary or amplification results) away from the acceleration region 29, 31 towards charge collection well 32. FIG. 3d replicates FIG. 3c, wherein the amplified charge has been fully propelled to the next amplifier stage. Thereafter, the voltage profile is once more returned to the one shown in FIG. 3b.

As shown in FIG. 3a-3d, between successive clock pulse electrodes (81, 82, 81, etcetera) a pair of avalanche electrodes (151, 152) has been provided for so realizing a two-phase organization. Naturally an embodiment in a four-phase CCD is feasible, an advantage of the two-phase configuration as shown being the small voltage step between DC2 and clock level 30. This will provide additional stability to the avalanching, because this step will pull charge carriers away from the transition immediately upon their arrival. A similar small voltage step exists between 28 and 26 for pushing charge carriers towards the ionizing field region.

Advantageous as compared to prior art, neither voltage $\Phi 1$ nor $\Phi 2$ participate in the amplification process; therefore, their temporal variations or instability have no effect on device performance.

Now, the arrangement of FIGS. 3a-d is the preferred embodiment of the invention. However, it may be advantageous in certain applications to omit certain of the above features. In fact, the maintaining of voltage DC2 (29) at its correct value is considered the prime rationale of the invention for maintaining the amplification factor. Further refinements are then the further providing of an essentially DC voltage at DC1 26, the stepping of the voltage in one or in two steps (29, 30) to the charge collection well at 32, and the stepping of the voltage in one or in two steps (27, 28) towards the impact ionization facility 31.

FIG. 3e shows a timing diagram with overlapping clock signals $\Phi 1$ and $\Phi 2$. Note as visible in the figure, that for both traces the higher level is kept for longer time than the lower level of the other trace at the same instant.

Figure 4A:
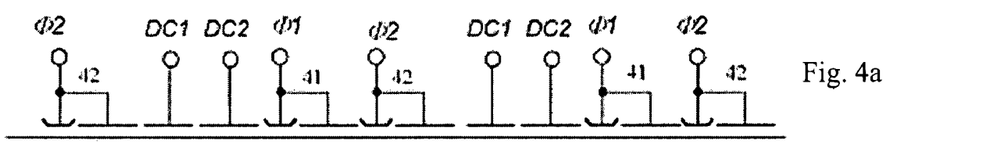
FIG. 4*a*, a view of various controls used for a second embodiment of the present invention.

FIG. 4a illustrates a view of various controls used for a second embodiment of the present invention. Here, each avalanche pair of DC1/DC2 electrodes is separated by a sequence of two clocked electrodes Φ1(41)/Φ2(42) that combine in the way of a roller-coaster: the potential is lowered in two successive steps, so that the swing of each individual signal (both Φ1 and Φ2) need only be approximately half of the original one of FIGS. 3b, c, for a given acceleration voltage difference between adjacent DC1, DC2 electrodes. This design facilitates the need of extremely high clock voltages. By itself, the serialization of the embodiment can be augmented to three or more electrodes (such as according to Φ41/Φ42/Φ41, et cetera, the next stage then starting with the correct alternating electrode). Again, the embodiment shown pertains to a two-phase CCD, although a four-phase CCD would be feasible in principle.

Figure 4B:
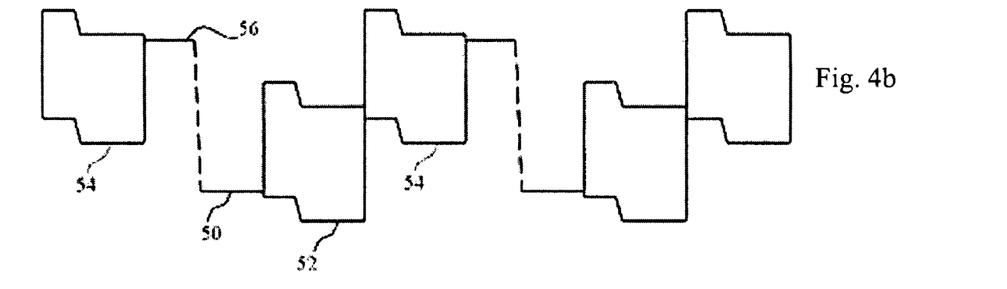
FIG. 4*b*, combined time-sequential voltage profiles in the device of FIG. 4*a*

FIG. 4b illustrates combined time-sequential voltage profiles in the device of FIG. 4a. Next to the dashed avalanching step, the two phases of Φ1(41)/Φ2(42) are clear in their mutual alternating. First, level 52 is driven high to create a temporary storage well for the amplified electrons from level 50; next, level 54 is lowered to propel the electrons to level 50 across barrier 56 and execute the amplification.

Figure 4C:
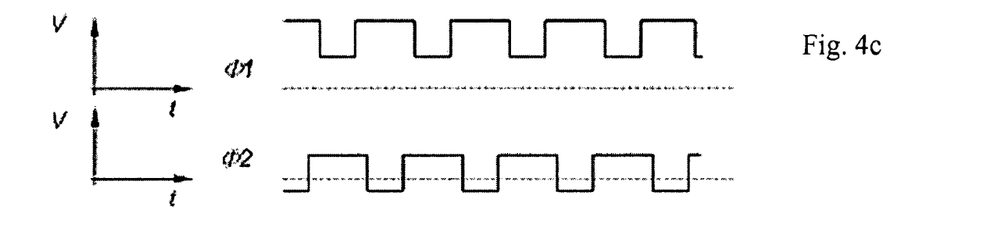
FIG. 4*c*, showing timing diagram with time- and voltage-overlapping clock signals Φ1, Φ2 with different DC bias.

FIG. 4c shows a time diagram with time- and voltage-overlapping clock signals Φ1, Φ2, each with a respective different DC bias, as shown by the dashed traces, as being applicable in the arrangement discussed hereabove. Apart from the bias, FIGS. 3e and 4c follow quite similar traces.

A few further comments are due. First, internal avalanching is feasible for both Frame Transfer FT and Interline IL types CCD image sensors, or even for mixed type CCD's. In principle, the approach of the present invention would be applicable to CMOS, be it that at present the required voltages cannot yet been realized.

Second, in theory, avalanche multiplication can be done internally in the sensor (item 82 in FIG. 2a), but for practical reasons, generally only an extra (linear) CCD register will apply.

The multiplication starts with electrons as charge carriers, which is advantageous for effecting a low noise figure. The charge carrying holes will almost immediately vanish into the semiconductor structure, which feature will keep noise still lower. Advantageously, although by no means mandatory, the multiplication is effected in a series of small steps each in their own electronic stage, as opposed to using a single large avalanche. The number of stages is usually found as a trade-off.

A few supplemental points are as follows. Due to the physical separation of temporary storage well from the avalanche field, channel potentials are not modulated by the charge packets, and linear amplification is possible. Exact value of the clock swing does not affect multiplication factors as long as appropriate charge transfer conditions are provided, which simplifies control electronics design.

Now, the present invention has hereabove been disclosed with reference to preferred embodiments thereof. Persons skilled in the art will recognize that numerous modifications and changes may be made thereto without exceeding the scope of the appended claims. In consequence, the embodiments should be considered as being illustrative, and no restrictions should be construed from those embodiments, other than as have been recited in the Claims.

The invention claimed is:

1. A charge multiplication device comprising:
a device stage that includes a series arrangement of a plurality of clock electrodes insulatively disposed over a semiconductor body,
wherein the series arrangement is operable for transporting packages of charge carriers through the semiconductor body from an image sensor section towards an output section, and
wherein an impact ionization region is formed in the semiconductor body between two neighboring clock electrodes when a substantially static voltage difference drives the two neighboring clock electrodes so as to induce an electric field in the impact ionization region within which charge multiplication occurs and through which charge carriers pass during their transport from the image section to the output section.

2. A device as claimed in claim 1, wherein said substantially static voltage difference defined by a first substantially static electric potential and by a second substantially static electric potential for controlling a strength of the electric field in the impact ionization region.

3. A device as claimed in claim 1, wherein an electrode for applying said second substantially static electric potential is followed by at least one output electrode that is arranged for being driven by at least one output dynamic electric potential for removing charge carriers away from said impact ionization region.

4. A device as claimed in claim 3, wherein an electrode for applying said first substantially static electric potential is preceded by at least one input electrode that is arranged for being driven by at least one input dynamic electric potential for pushing charge carriers towards said impact ionization region.

5. A device as claimed in claim 4, wherein said output dynamic electric potential is operative during periodic first time intervals, and said input dynamic electric potential is operative during periodic second time intervals, and wherein said first time intervals are period-wise overlapping with and bidirectionally extending beyond said second time intervals.

6. A device as claimed in claim 5, wherein the two neighboring clock electrodes, the at least one input electrode and the at least one output electrode are operable in a two-phase arrangement.

7. A device as claimed in claim 2 and arranged as a stage in a multi-stage amplification device, wherein:
successive impact ionization regions are separated by a sequence of at least one input electrode and at least one output electrode that are driven by an input dynamic electric potential and an output dynamic electric potential, respectively; and
said input and output dynamic electric potentials are overlapping for collectively bringing charge carriers from the second substantially static electric potential of a preceding stage to the first substantially static electric potential of a next succeeding stage.

8. A device as claimed in claim 1 that is furthermore arranged as part of an image sensor device.

9. A device as claimed in claim 8, comprising additional identical device stages serially arranged as an output register.

10. A device as claimed in claim 1 arranged as a stage in a multi-stage amplification device.

11. A semiconductor image sensor comprising a charge multiplication device according to claim 1.

12. A charge multiplication device comprising at least a stage of amplification, wherein:
the stage includes a series arrangement of a plurality of clock electrodes insulatively disposed over a semiconductor body, the series arrangement of the plurality of clock electrodes being operable to transport packages of charge carriers through the semiconductor body between an image sensor section and an output section;

two neighboring clock electrodes of the plurality of clock electrodes are operable to induce a controlled electric field in an impact ionization region within the semiconductor body in response to substantially static first and second electric potentials being applied respectively to the two neighboring clock electrodes, the two neighboring clock electrodes being disposed so that the impact ionization region is induced within the semiconductor body in a path through which the packages of charge carriers are to be transported;

a first electrode of the two neighboring clock electrodes to which is applied a substantially static first electric potential is preceded by at least one input electrode that is arranged for being driven by at least one first dynamic electric potential for pushing charge carriers towards said impact ionization zone;

a second electrode of the two neighboring clock electrodes to which is applied a substantially static second electric potential is followed by at least one output electrode that is arranged for being driven by at least one second dynamic electric potential for removing charge carriers away from said impact ionization zone;

said first dynamic electric potential is operative during periodic first time intervals;

said second dynamic electric potential is operative during periodic second time intervals; and said second time intervals are period-wise overlapping with and bidirectionally extending beyond said first time intervals.

* * * * *

UNITED STATES PATENT AND TRADEMARK OFFICE
CERTIFICATE OF CORRECTION

PATENT NO. : 7,485,840 B2
APPLICATION NO. : 11/703765
DATED : February 3, 2009
INVENTOR(S) : Leonid Yurievich Lazovsky

It is certified that error appears in the above-identified patent and that said Letters Patent is hereby corrected as shown below:

In line 2 of claim 2 (column 6), insert --is-- between "difference" and "defined".

In line 1 of claim 9 (column 6), insert --further-- between "8," and "comprising".

Signed and Sealed this

Sixth Day of October, 2009

David J. Kappos
*Director of the United States Patent and Trademark Office*

UNITED STATES PATENT AND TRADEMARK OFFICE
CERTIFICATE OF CORRECTION

PATENT NO. : 7,485,840 B2  
APPLICATION NO. : 11/703765  
DATED : February 3, 2009  
INVENTOR(S) : Leonid Yurievich Lazovsky Page 1 of 1

It is certified that error appears in the above-identified patent and that said Letters Patent is hereby corrected as shown below:

Column 6, Claim 2, line 37, insert --is-- between "difference" and "defined".

Column 6, Claim 9, line 54, insert --further-- between "8," and "comprising".

This certificate supersedes the Certificate of Correction issued October 6, 2009.

Signed and Sealed this

Twenty-seventh Day of October, 2009

David J. Kappos  
*Director of the United States Patent and Trademark Office*